(12) United States Patent
Saito et al.

(10) Patent No.: US 8,389,629 B2
(45) Date of Patent: Mar. 5, 2013

(54) ADHESIVE, ADHESIVE SHEET, MULTI-LAYERED ADHESIVE SHEET, AND PRODUCTION METHOD FOR ELECTRONIC PART

(75) Inventors: Takeshi Saito, Shibukawa (JP); Tomomichi Takatsu, Shibukawa (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 49 days.

(21) Appl. No.: 12/738,083

(22) PCT Filed: Oct. 16, 2007

(86) PCT No.: PCT/JP2007/070165
§ 371 (c)(1),
(2), (4) Date: Jun. 14, 2010

(87) PCT Pub. No.: WO2009/050785
PCT Pub. Date: Apr. 23, 2009

(65) Prior Publication Data
US 2010/0248452 A1    Sep. 30, 2010

(51) Int. Cl.
*C08L 83/06* (2006.01)
(52) U.S. Cl. ......... 525/101; 525/100; 428/447; 438/460
(58) Field of Classification Search .................. 525/100, 525/101; 428/447; 438/460
See application file for complete search history.

(56) References Cited

U.S. PATENT DOCUMENTS
2005/0205996 A1    9/2005    Usui et al.

FOREIGN PATENT DOCUMENTS

| JP | 2 123182 | 5/1990 |
|---|---|---|
| JP | 02-123182 | * 5/1990 |
| JP | 2 248064 | 10/1990 |
| JP | 7-45557 | 2/1995 |
| JP | 8 53655 | 2/1996 |
| JP | 11 293201 | 10/1999 |
| JP | 11-293201 | * 10/1999 |
| JP | 2002-158276 | 5/2002 |
| JP | 2002-226796 | 8/2002 |
| JP | 2003-073629 | 3/2003 |
| JP | 3410202 | 3/2003 |
| JP | 2004 186429 | 7/2004 |
| JP | 2004-221336 | 8/2004 |
| JP | 2005-268552 | 9/2005 |
| JP | 2006-137816 | 6/2006 |

OTHER PUBLICATIONS

English language translation JP 02-123182, May 1990.*
English language translation JP 11-293201, Oct. 1999.*
Ozawa, Takehiro et al., "Adhesive Properties of Ultraviolet Curable Pressure-Sensitive Adhesive Tape for Semiconductor Processing (I)—Interpretation via Rheological Viewpoint—", Furukawa Review, No. 106, pp. 31-36, (2000), (with English translation).
Huang Chu-shu, "Explore New Challenges of Wafer Level Die Attach Film for Wafer Preparation Process", Equipment for Electronic Produacts Manufacturing, vol. 136, May 2006, pp. 56-59.

* cited by examiner

*Primary Examiner* — Margaret Moore
(74) *Attorney, Agent, or Firm* — Oblon, Spivak, McClelland, Maier & Neustadt, L.L.P.

(57) ABSTRACT

A multi-layered adhesive sheet 100, includes: a substrate film 106, an adhesive layer 103 formed by coating an adhesive having a specific composition onto this substrate film 106, and a die attachment film 105 laminated on the adhesive layer 103. The multi-layered adhesive sheet 100 employing an adhesive having this specific composition has superior retention of die chip 108 during the dicing of silicon wafer 101, allows the die attachment film 105 and adhesive layer 103 to be easily peeled apart during a pick-up operation of the die chip 108, and prevents poor adhesion during the bonding of die chip 108 to lead frame 111.

15 Claims, 3 Drawing Sheets

Pick-up properties
◎ : At least 95% were picked-up
○ : 80 to 95% were picked-up
× : Less than 80% were picked-up

ADHESIVE, ADHESIVE SHEET, MULTI-LAYERED ADHESIVE SHEET, AND PRODUCTION METHOD FOR ELECTRONIC PART

TECHNICAL FIELD

The present invention relates to an adhesive, an adhesive sheet employing the adhesive, a multi-layered adhesive sheet employing the adhesive sheet, and a production method for an electronic part employing the multi-layered adhesive sheet.

BACKGROUND ART

As a production method for an electronic part such as an IC, a method of manufacturing a chip with a semiconductor wafer or insulating substrate as a base material, picking-up the chip, fixing it to a lead frame or the like via an adhesive agent or the like and sealing it with resin or the like to form an electronic part, is known. As the production method for the electronic part, a method of forming an electronic parts assembly by forming a circuit pattern on an insulating substrate or a semiconductor wafer of gallium arsenide, silicon or the like, attaching the electronic parts assembly to an adhesive sheet, then separating and cutting (dicing) it into individual chips after fixing it to a ring frame, elongating (expansion) the sheet when necessary, picking-up the chips, fixing the chips to the lead frame and the like via an adhesive agent, is widely performed (refer to Non-Patent Document 1).

A method of employing a multi-layered adhesive sheet (die attachment film all-in-one sheet) providing the combined functions of an adhesive agent that fixes a chip to a lead frame or the like, with that of an adhesive sheet for dice cutting, has been proposed. The die attachment film all-in-one sheet is an integrated multi-layered adhesive sheet of an adhesive sheet and a die attachment film. By employing the die attachment film all-in-one sheet in the production of an electronic part, a coating process of an adhesive agent can be omitted therefrom.

When compared to a method using an adhesive agent, the die attachment film all-in-one sheet is advantageous in that it is capable of controlling thickening of the adhered portions or preventing oozing. A die attachment film all-in-one sheet is employed in the production of semiconductor packages, such as a chip size package, a stack package, and a system-in-a-package (refer to Patent Documents 1 to 3).

As the adhesive of the adhesive sheet employed during the dicing of the electronic parts assembly, a method of employing a radiation polymerizable compound having at least two unsaturated bonds with a copolymer of a (meth)acrylic ester and hydroxyl group-containing polymerizable monomer, is known (refer to Patent Document 4).

As an acrylic adhesive, one containing a urethane acrylate oligomer and acrylic compound having various functional groups, having a Tg (glass transition temperature) of −60° C. to −30° C., and having a weight average molecular weight of 200,000 or more, is known (refer to Patent Document 5).

Patent Document 1: Japanese Patent Application Laid-Open Publication No. H02-248064;
Patent Document 2: Japanese Patent Application Laid-Open Publication No. H08-053655;
Patent Document 3: Japanese Patent Application Laid-Open Publication No. 2004-186429;
Patent Document 4: Japanese Patent No. 3410202;
Patent Document 5: Japanese Patent Application Laid-Open Publication No. H11-293201; and Non-Patent Document 1: T. Ozawa et al., *Adhesive Properties of Ultraviolet Curable Adhesive Tape for Semiconductor Processing (I)—Interpretation via Rheological Viewpoint*, Furukawa Review, No. 106, pp. 31-36, Furukawa Electric Co. Ltd. (July, 2000).

DISCLOSURE OF THE INVENTION

Problems to be Solved by the Invention

However, along with the higher integration of semiconductor parts, chip sizes have gotten considerably thinner, and cases in which pick-up operations of chips have become difficult after dicing have increased. Moreover, since the compatibility between an adhesive sheet and a die attachment film is comparatively higher than the compatibility between an adhesive sheet and a semiconductor wafer, there are instances where this leads to an insufficient reduction in adhesion even after exposure to an electron beam/ultraviolet rays, an inferiority in the easiness of peeling at the time of pick-up, and pick-up defects.

The present invention was achieved in view of the above-mentioned problems, and as such provides an adhesive, an adhesive sheet employing the adhesive, a multi-layered adhesive sheet employing the adhesive sheet and a production method for an electronic part employing the multi-layered adhesive sheet, allowing the adhesive sheet and the die attachment film to be easily peeled apart during pick-up, which in allows for a chip pick-up operation to be easily performed after dicing.

Means for Solving the Problems

According to the present invention, an adhesive is provided which contains a (meth)acrylic acid ester polymer, a urethane acrylate oligomer having at least four vinyl groups, and a silicone graft polymer.

According to the adhesive, it prevents pick-up defects in the chips because it allows for the easy peeling apart between a die attachment film and an adhesive layer of the adhesive sheet when picking-up chips after dicing. Moreover, along with being superior in chip retention during dicing, contamination of the die attachment film from a fine adhesive residue is also low. Accordingly, this adhesive may be preferably employed in the adhesive layer of a die attachment film all-in-one sheet.

Moreover, the abovementioned adhesive is one embodiment of the present invention; and an adhesive sheet employing the adhesive of the present invention, a multi-layered adhesive sheet employing the adhesive sheet, and a production method for an electronic part employing the multi-layered adhesive sheet, and the like, also embody similar technical features, and achieve similar effects.

Effects of the Invention

According to the present invention, because an adhesive having a specific composition is employed, it allows for easy peeling of a chip during a pick-up operation, while also allowing for favorable chip retention during dicing. Furthermore, because a die attachment film is not contaminated after dicing, the occurrence of poor adhesion between a chip attached to the die attachment film and a lead frame can be prevented.

EXPLANATION OF THE REFERENCE NUMERALS

| | |
|---|---|
| 100 | multi-layered adhesive sheet |
| 101 | silicon wafer |
| 102 | ring frame |
| 103 | adhesive layer |
| 104 | dicing blade |
| 105 | die attachment film |
| 106 | substrate film |
| 107 | incision |
| 108 | die chip |
| 110 | adhesive sheet |
| 111 | lead frame |

PREFERRED MODE FOR CARRYING OUT THE INVENTION

Hereinafter, embodiments of the present invention will be described with reference to the drawings. However, in cases where the same constituents are appended with the same reference numerals in each of the drawings, duplicate descriptions thereof will be omitted.

Description of the Terms

In the present specification, "monomer" refers to the monomers themselves or the structures derived from monomers. "Portion" and "percent" of the present specification refers to a mass basis, except where specifically described. In the present specification, a (meth)acryloyl group is a generic term for an acryloyl group and a methacryloyl group. The same also holds true for a compound including a (meth) such as (meth)acrylic acid and the like, in which the generic term is for a compound that does not include "meth" in the name and a compound that does include "meth" in the name. The number of functional groups within a urethane acrylate oligomer refers the number of vinyl groups per single urethane acrylate oligomer molecule.

Brief Overview of the Embodiments

Figure 1:
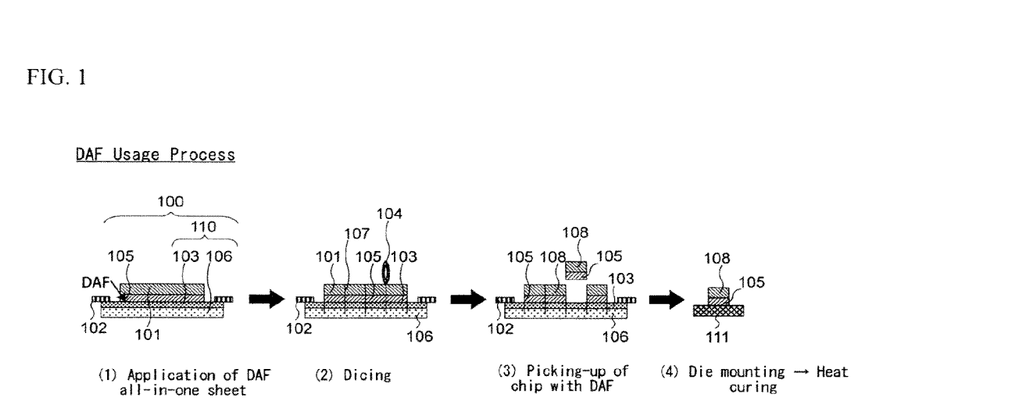
FIG. 1 is a cross-sectional view describing a structure of a multi-layered adhesive sheet of one embodiment of the present invention.

FIG. 1 is a cross-sectional view describing a structure of a multi-layered adhesive sheet of the present embodiment.

As shown in FIG. 1(1), the multi-layered adhesive sheet 100 of the present embodiment (die attachment film all-in-one sheet) includes: a substrate film 106, an adhesive layer 103 formed by coating the below-described adhesive onto this substrate film 106, and a die attachment film 105 laminated on this adhesive layer 103.

An adhesive sheet 110 refers to a sheet formed by combining the abovementioned substrate film 106 with the adhesive layer 103 formed by coating below-described adhesive onto the substrate film 106. Specifically, a multi-layered pressure-sensitive sheet 100 includes: an adhesive sheet 110, and a die attachment film 105 laminated on the adhesive layer 103 side of this adhesive sheet 110.

In addition, the abovementioned adhesive layer 103 is formed by being coated on the substrate film 106 with an adhesive containing a (meth)acrylic acid ester polymer, a urethane acrylate oligomer having at least four vinyl groups, and a silicone graft polymer.

The multi-layered pressure-sensitive sheet 100 employing adhesive having the abovementioned composition allows for easy peeling of the die attachment film 105 and the adhesive layer 103 of the adhesive sheet 110 during a pick-up operation of a die chip 108. Moreover, because the above-described multi-layered adhesive sheet 100 is also superior in chip retention, the peeling of the die chip 108 during dicing (hereinafter, referred to as "chip scattering") can be prevented.

Moreover, a production method for an electronic part employing the multi-layered adhesive sheet 100, allows for the pick-up of the die chip 108 with the die attachment film 105 attached to a rear surface of the die chip 108 after the dicing of a silicon wafer 101, and the die chip 108 to be mounted and bonded as is on a lead frame 111 or the like. In such cases, since the contamination of the die attachment film 105 from a fine adhesive residue is low, the occurrence of poor adhesion can be prevented.

Adhesive Layer

The adhesive layer 103 is composed of an adhesive containing a (meth)acrylic acid ester polymer, a urethane acrylate oligomer having at least four vinyl groups, and a silicone graft polymer. The above-described adhesive layer 103 composed of such an adhesive allows for easy peeling of the die attachment film 105 from the adhesive layer 103 during the pick-up operation of the die chip 108. Moreover, the chip retention during dicing is excellent, and the contamination of the die attachment film 105 is also low.

A (meth)acrylic acid ester polymer is a polymer in which a (meth)acrylic acid ester monomer is polymerized. Moreover, a (meth)acrylic acid ester polymer may also include a vinyl compound monomer other than a (meth)acrylic acid ester monomer.

As a monomer of a (meth)acrylic acid ester, butyl(meth)acrylate, 2-butyl(meth)acrylate, t-butyl(meth)acrylate, pentyl(meth)acrylate, octyl(meth)acrylate, 2-ethylhexyl(meth)acrylate, nonyl(meth)acrylate, decyl(meth)acrylate, lauryl(meth)acrylate, methyl(meth)acrylate, ethyl(meth)acrylate, isopropyl(meth)acrylate, tridecyl(meth)acrylate, myristyl(meth)acrylate, cetyl(meth)acrylate, stearyl(meth)acrylate, cyclohexyl(meth)acrylate, isoboronyl(meth)acrylate, dicyclopentanyl(meth)acrylate, benzyl(meth)acrylate, methoxyethyl(meth)acrylate, ethoxyethyl(meth)acrylate, butoxymethyl(meth)acrylate, and ethoxy-n-propyl(meth)acrylate, 2-hydroxyethyl(meth)acrylate, 2-hydroxypropyl(meth)acrylate, and 2-hydroxybutyl(meth)acrylate may be exemplified.

As the vinyl compound monomer, one having at least one of functional group selected from a hydroxyl group, a carboxyl group, an epoxy group, an amide group, an amino group, a methylol group, a sulphonic acid group, a sulfamic acid group, and a phosphite ester group may be preferably employed.

As the vinyl compound monomer having a hydroxyl group, a vinyl alcohol may be exemplified.

As the vinyl compound monomer having a carboxyl group, (meth)acrylic acid, crotonic acid, maleic acid, anhydrous maleic acid, itaconic acid, fumaric acid, acrylamido-N-glycolic acid, and cinnamic acid may be exemplified.

As the vinyl compound monomer having an epoxy group, allyl glycidyl ether and (meth)acrylic acid glycidyl ether may be exemplified.

As the vinyl compound monomer having an amide group, (meth)acrylamide may be exemplified.

As the vinyl compound monomer having an amino group, N,N-dimethyl aminoethyl(meth)acrylate may be exemplified.

As the vinyl compound monomer having a methylol group, N-methylol acrylamide may be exemplified.

A production method for the (meth)acrylic acid ester polymer may employ emulsion polymerization, solution polymerization, or the like. An acrylic rubber that is capable of being manufactured by emulsion polymerization is preferable, so as to allow for the adhesive sheet 110 and the die attachment film 105 to be easily peeled apart after exposure to radiation.

The urethane acrylate oligomer having at least four vinyl groups (hereinafter, also referred to as "urethane acrylate oligomer") is not specifically limited, so long as it is a (meth) acrylate oligomer having a urethane bond in the molecule and having at least four vinyl groups.

Although a production method for a urethane acrylate oligomer is not particularly limited in any way, reacting a (meth) acrylate compound containing a hydroxyl group and a plurality of (meth)acrylate groups with a compound (for example, a diisocyanate compound) having a plurality of isocyanate groups may be exemplified as a method for yielding a urethane acrylate oligomer. Moreover, a compound (for example, a diisocyanate compound) having a plurality of isocyanate groups may be added in excess to a polyol oligomer having a plurality of hydroxyl terminal groups, reacted therewith to yield an oligomer having a plurality of isocyanate terminal groups, then further reacted with a (meth)acrylate compound containing a hydroxyl group and plurality of (meth)acrylate groups to yield a urethane acrylate oligomer.

As the (meth)acrylate compound containing hydroxyl group and plurality of (meth)acrylate groups, hydroxypropylated trimethylolpropane triacrylate, pentaerythritol triacrylate, dipentaerythritol-hydroxy-penta acrylate, bis(pentaerythritol)-tetra acrylate, tetramethylol methane triacrylate, glycidol-diacrylate, or a compound substituting all or some of acrylate groups of these compounds with the methacrylate group may be exemplified.

As an isocyanate having a plurality of isocyanate groups, aromatic isocyanate, alicyclic isocyanate, and aliphatic isocyanate may be exemplified. Among isocyanates having a plurality of isocyanate groups, aromatic isocyanate or an alicyclic isocyanate may be preferably employed. As the form of an isocyanate compound, monomers, dimmers and trimers exist, with a trimer being preferably employed.

As an aromatic diisocyanate, tolylene diisocyanate, 4,4-diphenylmethane diisocyanate, and xylylene diisocyanate may be exemplified.

As an alicyclic diisocyanate, isophorone diisocyanate, and methylenebis(4-cyclohexyl isocyanate) may be exemplified.

As an aliphatic diisocyanate, hexamethylene diisocyanate, and trimethyl hexamethylene diisocyanate may be exemplified.

As the polyol oligomer having a plurality of hydroxyl terminal groups, poly(propylene oxide)diol, poly(propylene oxide)triol, copoly(ethylene oxide-propylene oxide)diol, poly(tetramethylene oxide)diol, ethoxylated bisphenol A, ethoxylated bisphenol S spiroglycol, caprolactone modified diol, and carbonate diol may be exemplified.

When the number of vinyl groups included in the urethane acrylate oligomer is less than four, there are instances where the die attachment film 105 and the adhesive layer 103 are not easily peeled apart after exposure to radiation, and there is a reduction in the pick-up properties of the die chip 108. On the other hand, while the number of vinyl groups included in the urethane acrylate oligomer is not particularly limited in any way, considering the availability and the manufacturing costs thereof, it is preferable that no more than 15 vinyl groups are included therein.

Although the compounding amount of the urethane acrylate oligomer is not particularly limited in any way, at least 20 parts by mass to no more than 200 parts by mass with respect to 100 parts by mass of (meth)acrylic acid ester polymer is preferable. When the compounding amount of the urethane acrylate oligomer having at least four vinyl groups is less than 20 parts by mass, there are instances where the adhesive sheet 110 and the die attachment film 105 are not easily peeled apart after exposure to ultraviolet rays and/or radiation, and problems occur with the pick-up properties of the die chip 108. Moreover, when compounded in excess of 200 parts by mass, along with instances where pick-up defects are caused by the scooping up of adhesive during dicing, there are instances where a fine residue is generated from a reaction residue, and where poor adhesion occurs when heat is applied during the mounting of the die chip 108 having the die attachment film 105 attached thereto on the lead frame 111.

The silicone graft polymer is not particularly limited in any manner, so long as is one in which a monomer having a vinyl group at an end of a silicone molecule chain (hereinafter, referred to as "silicone macromonomer") is polymerized. Thus, a homopolymer of a silicone macromonomer or a copolymer of another vinyl compound and a silicone macromonomer may be exemplified. The silicone macromonomer that is preferably employed is a compound having a vinyl group such as a (meth)acryloyl group or a styryl group at an end of a silicone molecule chain (refer to Patent Document 6).

As the abovementioned other vinyl compound, a (meth) acrylic monomer that is highly compatible with another polymer compounded into the adhesive is preferable. Employing such a highly compatible (meth)acrylic monomer keeps the entire adhesive homogeneous.

The (meth)acrylic monomer is not particularly limited in any particular manner, and thus alkyl(meth)acrylate, hydroxyalkyl(meth)acrylate, modified hydroxy(meth)acrylate, and (meth)acrylic acid may be exemplified. However, a hydroxyalkyl(meth)acrylate or a modified hydroxy(meth) acrylate is preferably employed due to their reactivity, in order to prevent fine residues referred to as "particles".

As the alkyl(meth)acrylate, methyl(meth)acrylate, ethyl (meth)acrylate, n-propyl(meth)acrylate, n-butyl(meth)acrylate, isobutyl(meth)acrylate, t-butyl(meth)acrylate, 2-ethylhexyl(meth)acrylate, lauryl(meth)acrylate, stearyl(meth) acrylate, and isobornyl(meth)acrylate, and hydroxyalkyl (meth)acrylate may be exemplified.

As the hydroxyalkyl(meth)acrylate, hydroxyethyl(meth) acrylate, hydroxypropyl(meth)acrylate, and hydroxybutyl (meth)acrylate may be exemplified.

As the modified hydroxy(meth)acrylate, ethylene oxide modified hydroxy(meth)acrylate, and lactone modified hydroxy(meth)acrylate may be exemplified.

Although the ratio of silicone macromonomeric units within the silicone graft polymer is not particularly limited in any manner, at least 15 parts by mass to no more than 50 parts by mass of silicone macromonomeric units with respect to 100 parts by mass of the silicone graft polymer is preferable. When the content of the silicone macromonomeric units is less than 15 parts by mass, there are instances where the adhesive sheet 110 and the die attachment film 105 are not easily peeled apart after exposure to radiation, and the pick-up properties of the die chip 108 degrades. Moreover, when the content of the silicone macromonomeric units exceeds 50 parts by mass, there instances where it bleeds out onto a surface of the adhesive layer 103, the die attachment film 105 is contaminated, and poor adhesion occurs when heat is applied during the mounting of the die chip 108 having the die attachment film 105 attached thereto on top of the lead frame 111.

Although the compounding amount of the silicone graft polymer is not particularly limited in any way, at least 0.1 parts by mass to no more than 10 parts by mass with respect to 100 parts by mass of (meth)acrylic acid ester polymer is preferable. When the compounding amount of the silicone graft polymer is less than 0.1 parts by mass, there are instances where the adhesive sheet 110 and the die attachment film 105 are not easily peeled apart after exposure to ultraviolet rays and/or radiation, and problems occur with the pick-up properties of the die chip 108. Furthermore, when the compounding amount of the silicone graft polymer exceeds 10 parts by mass, there are instances where initial adhesion is low, and it is peeled from ring frame 102 during dicing.

A tackifying resin may also be added to the adhesive in order to control adhesiveness. The tackifying resin is not particularly limited in any way, and thus rosin resin, rosin ester resin, terpene resin, terpene phenol resin, phenol resin, xylene resin, cumarone resin, cumarone-indene resin, styrene resin, aliphatic petroleum resin, aromatic petroleum resin, aliphatic aromatic copolymer petroleum resin, alicyclic hydrocarbon resin, and a modified product thereof, a derivative thereof, or a hydrogenated product thereof may be exemplified.

Although the compounding amount of the tackifying resin is not particularly limited in any manner, no more than 200 parts by mass is preferable, with no more than 30 parts by mass being optimal with respect to 100 parts by mass of (meth)acrylic acid ester polymer.

Various additives such a curing agent, a polymerization initiator, a softening agent, an anti-oxidizing agent, a bulking agent, a ultraviolet absorber, a photostabilizer, and the like may also be added to the adhesive.

A thickness of the adhesive layer 103 is preferably at least 1 μm, with a thickness of at least 2 μm being especially preferable. Furthermore, the thickness of the adhesive layer 103 is preferably no more than 100 μm, with a thickness of no more than 40 μm being especially preferable. When the thickness of the adhesive layer 103 is thinner than 1 μm, along with a reduction in adhesion and a reduction in chip retention during dicing, there are instances where peeling occurs between the ring frame 102 and the multi-layered adhesive sheet 100. Moreover, when the thickness of the adhesive layer 103 surpasses 100 μm, the adhesion becomes too strong, and there are instances where pick-up defects occur.

Adhesive Sheet

The adhesive sheet 110, which is produced by coating an adhesive on substrate film 106, is composed of substrate film 106 and adhesive layer 103 formed on this substrate film 106. The thickness of the substrate film 106 is preferably at least 30 μm, and even more preferably at least 60 μm. Furthermore, the thickness of the substrate film 106 is preferably no more than 300 μm, and even more preferably no more than 200 μm.

The raw material of the substrate film 106 is not particularly limited in any manner, and thus polyvinyl chloride, polyethylene terephthalate, ethylene-vinyl acetate copolymer, ethylene-acrylic acid-acrylic ester film, ethylene-ethylacrylate copolymer, polyethylene, polypropylene, ethylene-acrylic acid copolymer, and ionomer resin in which an ethylene-(meth)acrylic acid copolymer or ethylene-(meth) acrylic acid-(meth)acrylic acid ester copolymer or the like is crosslinked with a metal ion, may be exemplified. A mixture, a copolymer and a multi-layered film or the like of these resins may be employed in the substrate film 106.

Preferably, an ionomer resin is employed as raw material of the substrate film 106. Even among ionomer resins, using an ionomer resin in which a copolymer having ethylene units, (meth)acrylic acid units and (meth)acrylic acid alkyl ester units is crosslinked with metal ions such as $Na^+$, $K^+$ and $Zn^{2+}$, prevents the generation of beard shaped cutting debris, and thus it is preferably employed.

A forming method of the substrate film 106 is not particularly limited in any manner, and thus a calendar forming method, a T-die extrusion method, an inflation method, and a casting method may be exemplified.

In order to prevent the electrostatic charge during the peeling of the die attachment film 105, an antistatic treatment may be executed on a surface of the substrate film 106 that makes contact and/or does not make contact with the die attachment film 105. An anti-electrostatic agent may be introduced into the resin. The antistatic treatment may employ an anti-electrostatic agent such as a quaternary amine salt monomer.

As the quaternary amine salt monomer, quaternary dimethylaminoethyl(meth)acrylate chloride, quaternary diethylaminoethyl(meth)acrylate chloride, quaternary methylethylaminoethyl(meth)acrylate chloride, quaternary p-dimethylaminostyrene chloride, and quaternary p-diethylaminostyrene chloride may be exemplified, with quaternary dimethylaminoethyl(meth)acrylate chloride being preferably employed.

A method of use of the anti-electrostatic agent and the lubricant is not particularly limited in any manner, for example, an adhesive may be coated onto one side of the substrate film 106, and the lubricant and/or the anti-electrostatic agent may be coated onto a rear surface thereof; or the lubricant and/or the anti-electrostatic agent may be formed into a sheet by kneading it into the resin of the substrate film.

The die attachment film 105 is laminated onto the adhesive layer 103 on one side of the substrate film 106, which allows the other surface of the substrate film 106 to be an embossed surface with an average surface roughness (Ra) of at least 0.3 μm to no more than 1.5 μm. By placing the embossed surface on a machine table side of an expansion device (not shown), the substrate film 106 can be easily expanded via an expansion process after dicing.

The lubricant can be applied to a surface of the substrate film 106 that does not make contact with the die attachment film 105, and the lubricant can be kneaded into the substrate film 106, in order improve the expansion properties after dicing.

The lubricant is not particularly limited in any particular manner, so long as the material reduces the coefficient of friction between the adhesive sheet 110 and the expansion device (not shown). Thus, a silicone compound such as silicone resin, or (modified) silicone oil; fluororesin; hexagonal boron nitride; carbon black; and molybdenum disulfide may be exemplified. A plurality of these friction reducing agents may be used in combination. Because the production method for the electronic part is conducted in a clean room, it is preferable that a silicone compound or fluororesin is employed. Even among silicone compounds, a copolymer having silicone macromonomeric units demonstrates a particularly high degree of compatibility with an anti-electrostatic charge layer, and thus is preferably employed to balance the expansion properties and the electrostatic charge properties.

It is preferable that an arithmetic mean Ra of a surface of the substrate film 106 that is making contact with the die attachment film of 105 is at least 0.5 μm to no more than 1.5 μm, in order to improve the peelability between the adhesive sheet 110 and the die attachment film 105.

A mold-release treatment may be performed on a surface of the substrate film 106 that is making contact with the die attachment film of 105, in order to allow for the easy peeling between the adhesive sheet 110 and the die attachment film

105. A mold-release agent such as alkyd resin, silicone resin, fluororesin, unsaturated polyester resin, wax, and the like, is employed in the mold-release treatment.

The method for forming the adhesive sheet 110 by forming the adhesive layer 103 on the substrate film 106 is not particularly limited in any manner. For example, a method of directly coating the adhesive on the substrate film 106 via a coater such as a gravure coater, a comma coater, a bar coater, a knife coater, or a roll coater may be exemplified. The adhesive may also be printed on the substrate film 106 via relief printing, intaglio printing, lithographic printing, flexographic printing, offset printing, or screen printing.

Although the adhesive sheet 110 may also be used for fixing an electronic part employed during dicing or during back-grinding, it is preferable that the die attachment film 105 and the adhesive sheet 110 are laminated, and employed as the multi-layered adhesive sheet 100, which is capable of being employed in both a fixing of the electronic part during a dicing process and an attaching process to the lead frame 111.

Die Attachment Film

The die attachment film 105 is composed of an adhesive agent or an adhesive sheet in which an adhesive agent is formed into a film shape. The die attachment film 105 is commercially available as an adhesive agent or an adhesive laminated on a release film or the like that is composed of a PET resin or the like, and the adhesive agent or the adhesive can be transferred to an adherend.

The material of the die attachment film 105 may be any component of an adhesive or adhesive agent that is typically employed. As the adhesive, an epoxy, polyamide, an acrylic, and polyimide may be exemplified. As the adhesive agent, an acrylic, vinyl acetate, ethylene-vinyl acetate copolymer, ethylene-acrylic acid ester copolymer, polyamide, polyethylene, polysulfone, an epoxy, polyimide, polyamide acid, silicone, phenol, rubber polymer, fluororubber polymer, and fluororesin may be exemplified, with polyimide being preferably employed.

A mixture, a copolymer and a laminate of these components of the adhesive or adhesive agent may be employed in the die attachment film 105. An additive, such as a crosslinking promoter, an anti-electrostatic agent, and photopolymerization initiator may also be compounded into the die attachment film 105, where necessary.

Production Method for Electronic Part

In a production method for the electronic part, a method employing a multi-layered adhesive sheet 100, in which the die attachment film 105 is laminated on an adhesive coating surface of the adhesive sheet 110, is preferably employed. The production method for the electronic part employing the multi-layered adhesive sheet 100 of the present embodiment is not particularly limited in any manner. For example, the below-mentioned procedure indicated in FIG. 1 may be exemplified.

(1) The silicon wafer 101 is attached and fixed to the multi-layered adhesive sheet 100, and the multi-layered adhesive sheet 100 is fixed to the ring frame 102.

(2) The silicon wafer 101 is diced with the dicing blade 104.

(3) Ultraviolet rays and/or radiation (not shown) are irradiated from the substrate film 106 side of the multi-layered adhesive sheet 100, the interval of the die chip 108 is broadened by radially expanding the multi-layered adhesive sheet 100, and afterwards the die chip 108 is pressed up with a needle or the like (not shown). Next, the die chip 108 is suctioned via a vacuum collet or air pincette or the like (not shown), the adhesive sheet 110 and die attachment film 105 are peeled apart, and the die chip 108 having the die attachment film 105 attached thereto is picked-up.

(4) The die chip 108 having the die attachment film 105 attached thereto is mounted on the lead frame 111 or a circuit substrate. Then, the die attachment film 105 is heated, and the die chip 108 is thermally bonded to the lead frame 111 or a circuit substrate. Finally, the die chip 108 mounted on the lead frame 111 or the circuit substrate is molded via a resin (not shown).

A circuit substrate such as one formed of a circuit pattern may be employed in the present production method instead of the lead frame 111.

The light source of the ultraviolet and/or radiation is not particularly limited in any manner, and thus any known technology may be employed. As the ultraviolet light source, a low-pressure mercury lamp, a high-pressure mercury lamp, a ultra-high-pressure mercury lamp, and a metal halide lamp may be exemplified. The radiation to be preferably employed is an electron beam, an alpha ray, a beta ray, or a gamma ray.

By irradiating ultraviolet rays and/or radiation, the vinyl groups within the molecular compound forming the adhesive layer 103 form a three-dimensional network, and the adhesion of the adhesive layer 103 may be reduced. By doing so, superior chip retention may be exhibited because the adhesive layer 103 has high initial adhesion before irradiation with the ultraviolet rays and/or radiation; and the die attachment film 105 and the adhesive layer 103 are easily peeled apart, and the pick-up properties of the die chip 108 may be improved because the adhesion of the adhesive layer 103 is reduced after being irradiated with ultraviolet rays and/or radiation.

Although the abovementioned embodiment describes that the die attachment film 105 is interposed between the silicon wafer 101 and the adhesive sheet 110, a paste-like adhesive agent may also be employed to replace the die attachment film 105.

Typically, in cases where employing a paste-like adhesive agent, the paste-like adhesive agent is applied to the entire rear surface of the silicon wafer 101, specifically to a circuit non-forming surface for bonding the lead frame 111 or the circuit substrate, this is semi-cured into a sheet by the heating thereof, and an adhesive semi-cured layer formed. The above-formed adhesive semi-cured layer has the same function as the abovementioned die attachment film 105. Accordingly, the silicon wafer 101 on which the adhesive semi-cured layer is formed and the adhesive sheet 110 composed of the adhesive layer 103 and the substrate film 106 are pasted together, so that the adhesive semi-cured layer and the adhesive layer 103 are in contact, to form a structure identical to that of FIG. 1(1). Subsequently, similarly to a case where employing the die attachment film 105, dicing is performed using the dicing blade 104, a die chip having an adhesive semi-cured layer formed thereon is picked-up, and can be mounted and thermally bonded on the lead frame 111 or circuit substrate.

Other than the thermosetting properties of the paste-like adhesive agent, it is not specifically limited in any particular manner. For example, a mixture of one or a plurality of an acrylic, a vinyl acetate, an ethylene-vinyl acetate copolymer, an ethylene-acrylic acid ester copolymer, a polyamide, a polyethylene, polysulfone, an epoxy, a polyimide, a polyamide acid, a silicone, a phenol, a rubber polymer, a fluororubber polymer, and a fluororesin may be exemplified.

Effects

Hereinafter, the effects of the multi-layered adhesive sheet 100 of the present embodiment will be described with reference to FIG. 1.

As shown in FIG. 1(1), the multi-layered adhesive sheet 100 of the present embodiment includes: the substrate film 106, the adhesive layer 103 formed by coating the adhesive onto this substrate film 106, and the die attachment film 105 laminated on top of the adhesive layer 103.

In addition, the abovementioned adhesive layer 103 is composed of an adhesive containing the (meth)acrylic acid ester polymer, the urethane acrylate oligomer having at least four vinyl groups, and the silicone graft polymer.

According to the present adhesive, the pick-up operation of the die chip 108 shown in FIG. 1(3) may be favorably conducted because the adhesive layer 103 and the die attachment film 105 are easily peeled apart after being exposed to ultraviolet rays and/or radiation. Moreover, according to the above-described adhesive, the peeling of the die chip 108 during dicing shown in FIG. 1(2) (called "chip scattering") can be prevented because of also being superior in chip retention before exposure to ultraviolet rays and/or radiation. Furthermore, according to the above-described adhesive, the occurrence of poor adhesion via contaminants when mounting and thermally bonding die chip 108 having the die attachment film 105 attached thereto on top of the lead frame 111 as shown in FIG. 1(4) can be reduced, because of low contamination of the die attachment film 105 from a fine adhesive residue.

Moreover, the abovementioned adhesive preferably contains 100 parts by mass of the (meth)acrylic acid ester polymer, at least 20 parts by mass to no more than 200 parts by mass of the urethane acrylate oligomer having at least four vinyl groups, and at least 0.1 parts by mass to no more than 10 parts by mass of the silicone graft polymer.

This not only allows for the adhesive sheet 110 and the die attachment film 105 to be easily peeled apart after exposure to ultraviolet rays and/or radiation, but more preferably for the occurrence of a fine residue generated from a reaction residue or the scooping up of adhesive during dicing to be prevented, as well as the peeling of the multi-layered adhesive sheet 110 from the ring frame during dicing to be prevented.

Furthermore, the abovementioned adhesive is preferably a silicone graft polymer in which a (meth)acrylic acid ester monomer is polymerized as one of the constituent monomers.

In the present case, this is in order to allow for the homogeneity of the adhesive.

In addition, when the abovementioned adhesive includes the (meth)acrylic acid ester monomer as one of the constituent monomers, it is preferable that the (meth)acrylic acid ester monomer contains a hydroxyl group.

Thus, in addition to the adhesive being capable of homogeneity, reacting a hydroxyl group with at least an isocyanate group in a reaction residue of an urethane acrylate oligomer or an isocyanate group in an isocyanate curing agent, allows for the occurrence of contamination from the silicon graft polymer to be prevented.

Moreover, it is preferable that the adhesive sheet 110 includes the adhesive layer 103 formed by being coated with the abovementioned adhesive, and more preferably that the adhesive sheet 110 is for fixing an electronic part. Furthermore, it is preferable that the multi-layered adhesive sheet 100 contains: the adhesive sheet 110, and the die attachment film 105 laminated on the adhesive layer 103 side of the adhesive sheet 110.

Thus, according to the above-described adhesive sheet 110 or multi-layered adhesive sheet 100, the pick-up operation of the die chip 108 may be favorably conducted because the die attachment film 105 is easily peeled after being exposed to ultraviolet rays and/or radiation. Moreover, according to the above-described adhesive sheet 110 or multi-layered adhesive sheet 100, the peeling of the die chip 108 during dicing can be prevented because it is also superior in chip retention before exposure to ultraviolet rays and/or radiation. Furthermore, the occurrence of poor adhesion via contaminants when mounting and thermally bonding the die chip 108 having the die attachment film 105 attached thereto on top of the lead frame 111 because of low contamination (contamination of the die attachment film 105 from the adhesive layer 103 is reduced) of the die attachment film 105 from a fine adhesive residue.

In addition, a production method for the electronic part may be preferably employed, which includes: a process of pasting the silicon wafer 101 onto a surface of the die attachment film 105 of the abovementioned multi-layered adhesive sheet 100; a process of performing dicing on the silicon wafer 101 with it pasted to the multi-layered adhesive sheet 100; and a process of picking-up both the silicon wafer 101 and the die attachment film 105 attached to the rear surface of the silicon wafer 101, by the peeling of the die attachment film 105 from the adhesive layer 103 after dicing.

In the present case, because of the exposure (not shown) of the ultraviolet rays and/or radiation from the side of the substrate film 106 of the multi-layered adhesive sheet 100 after the dicing of the silicon wafer 101, the die chip 108 can be easily picked-up with the die attachment film 105 attached to a rear surface of the die chip 108, and the die chip 108 can be further mounted and bonded as is to the lead frame 111 or the like. In addition, according to the present production method for the electronic part, peeling of the die chip 108 during dicing (called "chip scattering") can be prevented because it is also superior in chip retention before exposure to ultraviolet rays and/or radiation. Furthermore, according to the present production method for the electronic part, because the contamination of the die attachment film 105 from a fine adhesive residue is low, the occurrence of poor adhesion from contamination when the die chip 108 having the die attachment film 105 attached thereto is mounted and thermally bonded on top of the lead frame 111 can be prevented.

Moreover, as described with reference to a figure for a DAF usage process of FIG. 1, a production method for the electronic part may be preferably employed, which includes: a process (not shown) of applying a paste-like adhesive agent 105 to the entire rear surface of the silicon wafer 101; a process (not shown) of forming an adhesive semi-cured layer 105 by heating the paste-like adhesive agent 105 to semi-cure it into a sheet; a process (FIG. 1 (1)) of pasting together the adhesive semi-cured layer 105 of the silicon wafer 101 and the adhesive layer 103 of the adhesive sheet 110; a process (FIG. 1 (2)) of performing dicing on the silicon wafer 101 attached to the adhesive sheet 110; a process (FIG. 1 (3)) of picking-up both the silicon wafer 101 and the adhesive semi-cured layer 105 attached to a rear surface of the silicon wafer 101, by the peeling of the adhesive semi-cured layer 105 from the adhesive layer 103.

In the present case, because of the exposure (not shown) of the ultraviolet rays and/or radiation from the side of the substrate film 106 of the adhesive sheet 110 after the dicing of the silicon wafer 101, the die chip 108 can be easily picked-up with the adhesive semi-cured layer 105 attached to a rear surface of the die chip 108, and the die chip 108 can be further mounted and bonded as is to the lead frame 111 or the like. Furthermore, according to the present production method for the electronic part, because the contamination of the adhesive semi-cured layer 105 from the adhesive layer 103 is low, the occurrence of poor adhesion from contamination when the die chip 108 having the adhesive semi-cured layer 105 attached thereto is mounted and thermally bonded on top of the lead frame 111 can be prevented.

Although the embodiments of the present invention have been explained above with reference to the drawings, these are merely examples, and thus various embodiments other than those mentioned above may also be employed where necessary.

For example, although the silicon wafer 101 is used as the type of wafer in the abovementioned embodiment, any type of wafer may be employed (for example, a GAN wafer, etc.), without any particular limitations thereon. Regardless of the type of wafer, because the dicing blade 104 exists to properly cut such a wafer, a processing method for a wafer similar to that of the abovementioned embodiment is feasible using the dicing blade 104, and the effects obtained therefrom similar even in such cases.

EXAMPLES

Hereinafter, the present invention will be described in even greater detail via Examples. However, the present invention is not specifically limited to these Examples.

Preparation of Experimental Materials

The various experimental materials, such as the adhesive, the adhesive sheet, and the multi-layered adhesive sheet were produced by the below-mentioned formulation.

1. As the multi-layered adhesive sheet, the following was prepared.

A (meth)acrylic acid ester polymer A: a copolymer of 54% ethyl acrylate, 22% butyl acrylate, and 24% methoxy ethyl acrylate, which was obtained via suspension polymerization (one of our polymer products).

A (meth)acrylic acid ester polymer B: a copolymer of 95% 2-ethylhexyl acrylate, and 5% 2-hydroxy ethyl acrylate, which was obtained via solution polymerization (one of our polymer products).

Urethane acrylate oligomer A: a terminally-acrylated oligomer, yielded by reacting the end of a poly(propylene oxide) diol with a trimer of a hexamethylene diisocyanate (aliphatic diisocyanate) to yield a terminally-isocyanated oligomer, and then further reacting the terminally-isocyanated oligomer with a dipentaerythritol pentaacrylate. The urethane acrylate oligomer had 15 functional acrylate groups (15 functional groups), and the number average molecular weight (Mn) was 3,700 (one of our polymer products).

Urethane acrylate oligomer B: a terminally-acrylated oligomer, yielded by reacting the end of a poly(propylene oxide) diol with a tolylene diisocyanate (aromatic diisocyanate) to yield a terminally-isocyanated oligomer, and then further reacting the terminally-isocyanated oligomer with a dipentaerythritol pentaacrylate. There were 10 functional acrylate groups (10 functional groups), and the Mn was 3,800 (one of our polymer products).

Urethane acrylate oligomer C: a terminally-acrylated oligomer, yielded by reacting the end of a poly(ethylene oxide) diol with a trimer of isophorone diisocyanate (alicyclic diisocyanate) to yield a terminally-isocyanated oligomer, and then further reacting the terminally-isocyanated oligomer with a dipentaerythritol pentaacrylate. There were 10 functional acrylate groups (10 functional groups) per molecule, and the Mn was 2,800 (one of our polymer products).

Urethane acrylate oligomer D: a terminally-acrylated oligomer, yielded by reacting the end of a poly(propylene oxide) diol with a hexamethylene diisocyanate to yield a terminally-isocyanated oligomer, and then further reacting the terminally-isocyanated oligomer with 2-hydroxyethyl acrylate. There were two vinyl groups (two functional groups) per molecule, and the number average molecular weight Mn was 3,400 (one of our polymer products).

Silicone graft polymer A: a silicone graft polymer (one of our polymer products), in which a 30 parts by mass of a silicone graft oligomer, 20 parts by mass of a butyl acrylate, 30 parts by mass of a methyl methacrylate, and 20 parts by mass 2-hydroxy methylacrylate were polymerized. As the silicone graft oligomer, a silicone graft oligomer (one of our polymer products) having a methacryloyl group at an end of a silicone molecule chain was employed.

Silicone graft polymer B: a silicone graft polymer (one of our polymer products), in which a 30 parts by mass of a silicone graft oligomer, 20 parts by mass of a butyl acrylate, 20 parts by mass of a methyl methacrylate, 20 parts by mass of 2-hydroxy methylacrylate, and 10 parts by mass of a methacrylic acid were polymerized, and then further addition-polymerized with glycidyl methacrylate. As the silicone graft oligomer, a silicone graft oligomer (one of our polymer products) having a methacryloyl group at an end of a silicone molecule chain was employed.

Silicone compound A: a silicone oil (product name: KF-96, manufactured by Shin-Etsu Chemical Corporation).

Photopolymerization initiator: benzyl dimethyl ketal (product name: Irgacure 651, manufactured by Ciba Specialty Chemicals).

Curing agent: 1,6-hexamethylene diisocyanate-trimethylol propane adduct (manufactured by Nippon Polyurethane Industry, Company, Ltd., product name: Colonate HL)

The main components and compounding amount thereof in the adhesive corresponding to each experimental number are indicated in the Tables 1 and 2, and in addition to the components indicated in these Tables, three parts by mass of the photopolymerization initiator and three parts by mass of the curing agent were compounded during the preparation of each adhesive. Moreover, the type of compound and the compounding amount thereof are concisely indicated in Tables 1 and 2, for example in a case where 100 parts by mass of (meth)acrylic acid ester polymer A was compounded, "A100" was simply indicated in the corresponding column. Accordingly, for example, the adhesive according to the experimental number 1 includes 100 parts by mass of (meth)acrylic acid ester polymer A, 100 parts by mass of urethane acrylate oligomer A, and one part by mass of silicone graft polymer A, as well as three parts by mass of the photopolymerization initiator and three parts by mass of the curing agent.

Next, the adhesive was coated on a separator film until a thickness of the adhesive layer reached 10 μm after drying, this was then laminated on a 100 μm PE substrate film to obtain an adhesive sheet. A die attachment film with a 30 μm thickness was laminated on the adhesive layer to obtain the multi-layered adhesive sheet.

As a base film, a film including an ionomer resin composed mainly of a Zn salt of an ethylene-methacrylic acid-methacrylic acid alkyl ester copolymer, having a melt flow rate (MFR) of 1.5 g/10 min (JIS K7210, 210° C.) and a melting point of 96° C., and containing $Zn^{2+}$ ions (product name: Himilan 1650, manufactured by Du Pont-Mitsui Polychemicals Company), was employed.

2. As the die attachment film, the following was prepared.

Die attachment film: a film with a thickness of 30 composed of a mixture of a polyimide adhesive agent and an epoxy adhesive agent.

3. As the electronic parts assembly, the following was prepared.

In the process for the electronic part, a silicon wafer on which a dummy circuit pattern was formed and having a diameter of six inches and a thickness of 0.4 mm was employed.

Dicing Process

The depth of the incision into the adhesive sheet was 30 μm. The dicing was performed so as to be a chip size of 10 mm×10 mm.

The dicing device that was employed was a DAD 341, manufactured by Disco Corporation. The dicing blade that was employed was an NBC-ZH205O-27HEEE, manufactured by Disco Corporation.

Dicing blade shape: an outer diameter of 55.56 mm, a blade thickness of 35 μm, and an inner diameter of 19.05 mm.
Dicing blade revolution number: 40,000 rpm.
Dicing blade feed rate: 80 mm/sec.
Cutting water temperature: 25° C.
Amount of cutting water: 1.0 L/min.

Expansion Process

After the silicon wafer attached to the multi-layered adhesive sheet was diced, expansion was conducted using an expansion device.
Expansion device: HS-1800, manufactured by Hugle Electronics, Incorporated.
Expansion amount: 20 mm.
Expansion speed: 20 mm/sec.
Heating conditions: 40° C.×1 min.

Evaluation of Experimental Results

1. Adhesion of the multi-layered adhesive sheet: a multi-layered adhesive sheet that was preheated to 80° C. was pasted on a silicon wafer, it was pressure bonded by rolling a 2 kg roller back and forth one time. The die attachment film and the adhesive sheet was peeled apart at their interface one day after pressure bonding, using samples before/after they were irradiated with 300 mJ/cm² of ultraviolet rays. The results thereof are indicated in Tables 1 and 2.
Peeling method: 180° peel.
Tensile speed: 300 mm/min.

Figure 2:
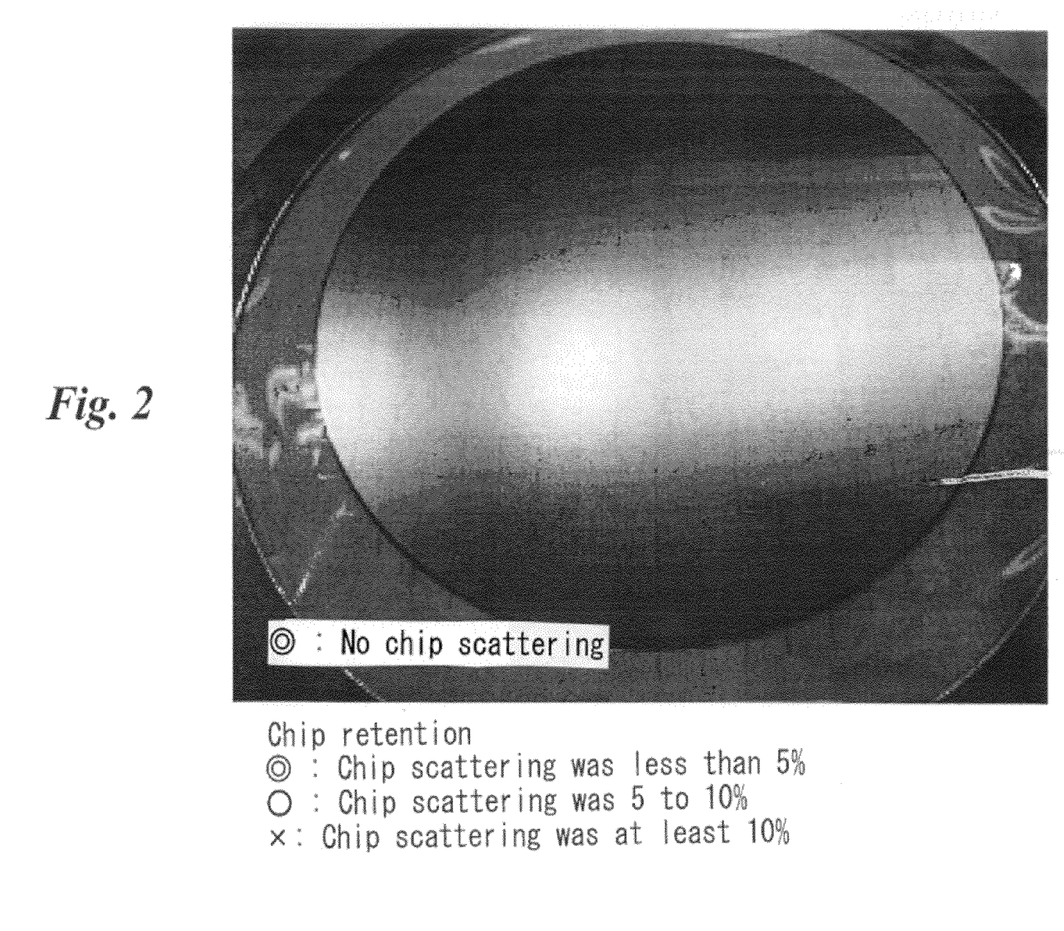
FIG. 2 is a photograph for describing chip retention.

2. Chip retention properties: the number of chips retained on the multi-layered adhesive sheet, as indicated in FIG. 2, was evaluated when the dicing of the silicon wafers was performed under the abovementioned conditions. The results thereof are indicated in Tables 1 and 2.

⊚ (Superior) At least 95% of the chips were retained on the multi-layered adhesive sheet.
○ (Good) At least 90% to less than 95% of the chips were retained on the multi-layered adhesive sheet.
X (Unacceptable) Less than 90% of the chips were retained on the multi-layered adhesive sheet.

Figure 3:
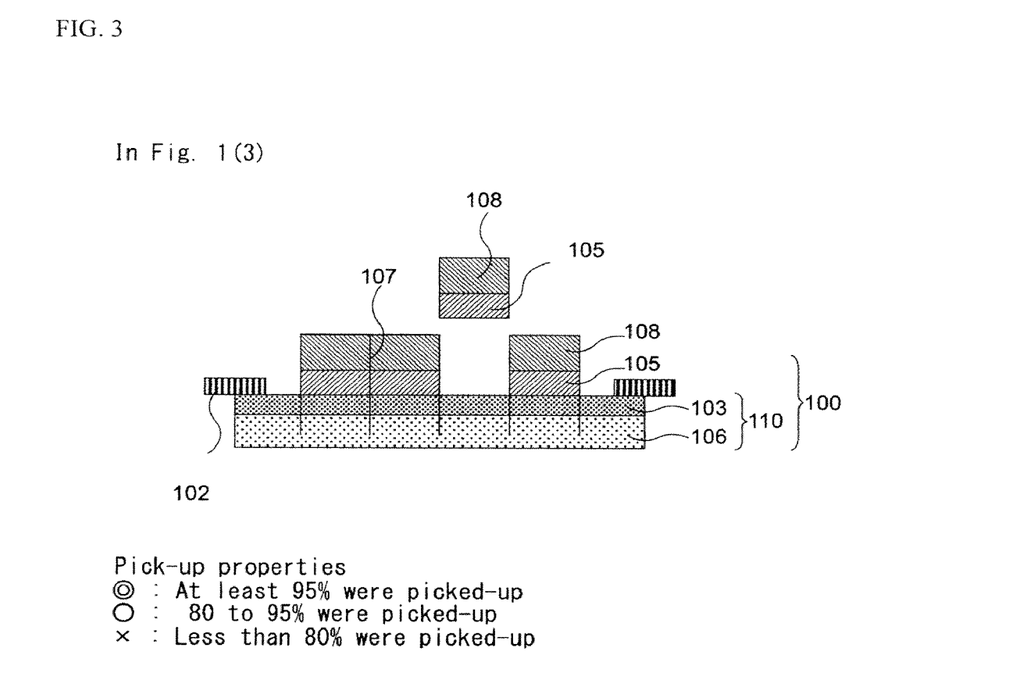
FIG. 3 is a schematic diagram for describing a pick-up property.

3. Pick-up properties: the silicon wafers were diced and expanded under the abovementioned conditions, and afterwards the number of chips that could be picked-up with the die attachment film attached thereto as indicated in FIG. 3 was evaluated. The results thereof are indicated in Tables 1 and 2.

⊚ (Superior) At least 95% of the chips were picked-up.
○ (Good) At least 80% to less than 95% of the chips were picked-up.
X (Unacceptable) Less than 80% of the chips were picked-up.

4. Contamination: the adhesive sheet was pasted onto a silicon mirror wafer, it was irradiated under a high-pressure mercury lamp for 20 minutes with 300 mJ/cm² of ultraviolet rays, and afterwards the adhesive sheet was peeled off. The number of residual particles that were at least 0.28 μm on a pasted upper surface of the silicon mirror wafer (five inches) was measured using a particle counter. The results thereof are indicated in Tables 1 and 2.

⊚ (Excellent) Less than 500 particles.
○ (Good) Less than 2,000 particles.
X (Unacceptable) At least 2,000 particles.

TABLE 1

| | | Experimental number | | | | | | | | |
|---|---|---|---|---|---|---|---|---|---|---|
| | | 1 | 2 | 3 | 4 | 5 | 6 | 7 | 8 | 9 |
| Adhesive layer (see notes) | (meth)acrylic acid ester polymer | A 100 | A 100 | A 100 | A 100 | A 100 | A 100 | A 100 | A 100 | A 100 |
| | urethane acrylate oligomer | A 100 | A 10 | A 20 | A 200 | A 250 | A 100 | A 100 | A 100 | A 100 |
| | silicone graft polymer | A 1 | A 1 | A 1 | A 1 | A 1 | A 0.1 | A 0.05 | A 10 | A 20 |
| | silicone compound | — | — | — | — | — | — | — | — | — |
| Adhesion Evaluation | with respect to the die attachment film (before UV exposure) N/20 mm | 5.30 | 4.30 | 4.80 | 5.80 | 5.90 | 5.85 | 5.90 | 2.80 | 0.80 |
| | with respect to the die attachment film (after UV exposure) N/20 mm | 0.24 | 0.55 | 0.45 | 0.22 | 0.23 | 0.44 | 0.38 | 0.18 | 0.18 |
| Evaluation | Chip retention properties | ⊚ | ⊚ | ⊚ | ⊚ | ⊚ | ⊚ | ⊚ | ⊚ | ○ |
| | Pick-up properties | ⊚ | ○ | ⊚ | ⊚ | ○ | ⊚ | ○ | ⊚ | ⊚ |
| | Contamination | ⊚ | ⊚ | ⊚ | ⊚ | ○ | ⊚ | ⊚ | ⊚ | ○ |
| | Remarks | Example | Example | Example | Example | Example | Example | Example | Example | Example |

Notes:
Type and compounding amount (parts by mass)

TABLE 2

| | | Experimental number | | | | | | | | |
|---|---|---|---|---|---|---|---|---|---|---|
| | | 1 | 10 | 11 | 12 | 13 | 14 | 15 | 16 | 17 |
| Adhesive layer (see notes) | (meth)acrylic acid ester polymer | A 100 | B 100 | A 100 | A 100 | A 100 | A 100 | A 100 | A 100 | A 100 |
| | urethane acrylate oligomer | A 100 | A 100 | B 100 | C 100 | D 100 | A 100 | A 100 | — | A 100 |
| | silicone graft polymer | A 1 | A 1 | A 1 | A 1 | A 1 | B 1 | — | A 1 | — |
| | silicone compound | — | — | — | — | — | — | A 1 | — | — |

TABLE 2-continued

| | | Experimental number | | | | | | | | |
|---|---|---|---|---|---|---|---|---|---|---|
| | | 1 | 10 | 11 | 12 | 13 | 14 | 15 | 16 | 17 |
| Adhesion Evaluation | with respect to the die attachment film (before UV exposure) N/20 mm | 5.30 | 2.70 | 5.70 | 5.00 | 3.30 | 5.60 | 3.80 | 1.10 | 5.80 |
| | with respect to the die attachment film (after UV exposure) N/20 mm | 0.24 | 0.54 | 0.33 | 0.43 | 5.20 | 0.18 | 0.50 | 1.10 | 0.80 |
| Evaluation | Chip retention properties | ◎ | ◎ | ◎ | ◎ | ◎ | ◎ | ◎ | ○ | ○ |
| | Pick-up properties | ◎ | ○ | ○ | ○ | X | ◎ | ○ | X | X |
| | Contamination | ◎ | ◎ | ◎ | ◎ | ◎ | ◎ | X | X | X |
| | Remarks | Example | Example | Example | Example | Comparative Example | Example | Comparative Example | Comparative Example | Comparative Example |

Notes:
Type and compounding amount (parts by mass)

Experimental Discussion

As understood from the experimental results indicated in Tables 1 and 2, the multi-layered adhesive sheet employing the adhesive according to the present invention is superior in chip retention properties during dicing, allows the die attachment film and the adhesive layer to be easily peeled apart during the pick-up operation, and is also low in its contamination from fine adhesive residues.

While the present invention has been described with reference to several particular embodiments thereof, it is understood that various modifications are possible and those skilled in the art would also be able to make such modifications without departing from the true spirit and scope of the invention.

INDUSTRIAL APPLICABILITY

Because a multi-layered adhesive sheet employed in the present invention achieves the effects of being superior in chip retention during dicing, allowing easy peeling from a chip during a pick-up operation and being low in contamination from a fine adhesive residue, it can be preferably employed in a production method for an electronic part in which a chip with a die attachment film layer attached to a rear surface thereof is picked-up after dicing, and it is mounted and bonded onto the lead frame or the like.

The invention claimed is:

1. An adhesive, comprising:
a (meth)acrylic acid ester polymer comprising a copolymer comprising ethyl acrylate, butyl acrylate and methoxy ethyl acrylate;
a urethane acrylate oligomer having at least four vinyl groups formed by reacting a (meth)acrylate compound containing a hydroxyl group and a plurality of (meth)acrylate groups with an isocyanate trimer; and
a silicone graft polymer comprising a (meth)acrylic acid ester monomer at an end of a silicone molecule chain, wherein the (meth)acrylic acid ester monomer is one of a prepolymerization compound,
wherein the adhesive comprises at least 20 parts by mass to no more than 200 parts by mass of the urethane acrylate oligomer having at least four vinyl groups and at least 0.1 parts by mass to no more than 10 parts by mass of the silicone graft polymer, with respect to 100 parts by mass of the (meth)acrylic acid ester polymer.

2. The adhesive according to claim 1, wherein the (meth)acrylic acid ester monomer includes a hydroxyl group.

3. The adhesive according to claim 1, wherein the urethane acrylate oligomer has 10-15 vinyl groups.

4. The adhesive according to claim 1, wherein the (meth)acrylic acid ester polymer consists of the ethyl acrylate, butyl acrylate and methoxy ethyl acrylate.

5. An adhesive, comprising:
a (meth)acrylic acid ester polymer comprising a copolymer comprising ethyl acrylate, butyl acrylate and methoxy ethyl acrylate;
a urethane acrylate oligomer having at least four vinyl groups formed by reacting a (meth)acrylate compound containing a hydroxyl group and a plurality of (meth)acrylate groups with an isocyanate trimer; and
a silicone graft polymer comprising a (meth)acrylic acid ester monomer at an end of a silicone molecule chain, wherein the (meth)acrylic acid ester monomer is one of a prepolymerization compound,
wherein the adhesive, when used in an adhesive sheet provides proper adhesion and peelability toward a die attachment film or an adhesive semi-cured layer.

6. An adhesive sheet, comprising:
a substrate film; and
an adhesive layer formed by coating the adhesive of claim 1 on the substrate film.

7. The adhesive sheet according to claim 6, wherein the adhesive sheet is for fixing an electronic part.

8. A multi-layered adhesive sheet, comprising:
the adhesive sheet according to claim 7; and
a die attachment film laminated on the adhesive layer side of the adhesive sheet.

9. A production method for an electronic part obtained by dicing a wafer, comprising the steps of:
pasting a wafer on a surface of the die attachment film of the multi-layered adhesive sheet of claim 8;
dicing the wafer with it pasted to the multi-layered adhesive sheet; and
picking-up both the wafer and the die attachment film attached to a rear surface of the wafer, by peeling apart the die attachment film and the adhesive layer after the dicing.

10. A production method for an electronic part obtained by dicing a wafer, comprising the steps of:
applying a paste-like adhesive agent to an entire rear surface of the wafer;
forming an adhesive semi-cured layer by heating the paste-like adhesive agent to semi-cure it into a sheet;
pasting together the adhesive semi-cured layer of the wafer and the adhesive layer of the adhesive sheet of claim 7;
dicing the wafer with it pasted to the adhesive sheet; and
picking-up both the wafer and the adhesive semi-cured layer attached to a rear surface of the wafer, by peeling apart the adhesive semi-cured layer and the adhesive layer after the dicing.

11. The adhesive according to claim 5, wherein the (meth)acrylic acid ester polymer consists of the ethyl acrylate, butyl acrylate and methoxy ethyl acrylate.

12. The adhesive according to claim 11, wherein the adhesive comprises at least 20 parts by mass to no more than 200 parts by mass of the urethane acrylate oligomer having at least four vinyl groups and at least 0.1 parts by mass to no more than 10 parts by mass of the silicone graft polymer, with respect to 100 parts by mass of the (meth)acrylic acid ester polymer.

13. The adhesive according to claim 11, wherein the urethane acrylate oligomer has 10-15 vinyl groups.

14. A method for dicing a silicon wafer, comprising:
applying an adhesive to the silicon wafer, then
dicing the silicon wafer to form a die chip having the adhesive on a surface;
wherein the adhesive comprises a (meth)acrylic acid ester polymer comprising a copolymer comprising ethyl acrylate, butyl acrylate and methoxy acrylate;
a urethane acrylate oligomer having at least four vinyl groups formed by reacting a methacrylate compound containing a hydroxyl group and a plurality of (meth)acrylate groups with an isocyanate trimer; and
a silicone graft polymer comprising a (meth)acrylic acid ester monomer at an end of a silicone molecule chain, wherein the (meth)acrylic acid ester monomer is a pre-polymerization compound.

15. The method according to claim 14, wherein the adhesive comprises at least 20 parts by mass to no more than 200 parts by mass of the urethane acrylate oligomer having at least four vinyl groups; and at least 0.1 parts by mass to no more than 10 parts by mass of the silicone graft polymer, with respect to 100 parts by mass of the (meth)acrylic acid ester polymer.

* * * * *